(12) United States Patent
Van De Putte et al.

(10) Patent No.: US 11,367,596 B2
(45) Date of Patent: Jun. 21, 2022

(54) ELECTRICAL TRANSFER IN AN ENDBLOCK FOR A SPUTTER DEVICE

(71) Applicant: SOLERAS ADVANCED COATINGS BVBA, Deinze (BE)

(72) Inventors: Ivan Van De Putte, Waregem (BE); Niek Dewilde, Kruishoutem (BE); Koen Corteville, Izegem (BE)

(73) Assignee: SOLERAS ADVANCED COATINGS BV, Deinze (BE)

( * ) Notice: Subject to any disclaimer, the term of this patent is extended or adjusted under 35 U.S.C. 154(b) by 416 days.

(21) Appl. No.: 16/316,841

(22) PCT Filed: Jun. 29, 2017

(86) PCT No.: PCT/IB2017/053895
§ 371 (c)(1),
(2) Date: Jan. 10, 2019

(87) PCT Pub. No.: WO2018/011662
PCT Pub. Date: Jan. 18, 2018

(65) Prior Publication Data
US 2019/0237306 A1    Aug. 1, 2019

(30) Foreign Application Priority Data

Jul. 13, 2016 (BE) .................................. 2016/5584

(51) Int. Cl.
*H01J 37/34* (2006.01)
*H01J 37/32* (2006.01)
*C23C 14/34* (2006.01)

(52) U.S. Cl.
CPC .... *H01J 37/32577* (2013.01); *H01J 37/3435* (2013.01); *H01J 37/3444* (2013.01); *H01J 37/3497* (2013.01); *C23C 14/34* (2013.01)

(58) Field of Classification Search
CPC ............. H01J 37/32577; H01J 37/3435; H01J 37/3444; H01J 37/3497; C23C 14/34
(Continued)

(56) References Cited

U.S. PATENT DOCUMENTS 5,096,562 A   3/1992   Boozenny et al.
5,200,049 A   4/1993   Stevenson et al.
(Continued)

FOREIGN PATENT DOCUMENTS

CN   1126770 A    7/1996
CN   2808932 Y    8/2006
(Continued)

OTHER PUBLICATIONS

Belgian Search Report from BE Application No. 201605584, dated Mar. 16, 2017.
(Continued)

*Primary Examiner* — Rodney G McDonald
(74) *Attorney, Agent, or Firm* — Workman Nydegger (57) ABSTRACT

A power transfer system is described for transfer of electrical power to a sputter target in a sputter device. It comprises a first part comprising a contact surface positionable against a first part of an endblock of the sputter device, a second part inseparably connected to the first part and a third part, and a third part comprising a contact surface positionable against a second part of the endblock or directly against a sputter target when mounted on the endblock. At least two of the three parts are formed as one monolithic piece. One of the parts of the power transfer system is resilient such that, when mounted, the power transfer system is clamped between the first part of the endblock and the second part of the endblock or the sputter target. This part is also responsible for the transfer of electrical power.

20 Claims, 4 Drawing Sheets

(58) Field of Classification Search
USPC .......................................... 204/298.21, 298.22
See application file for complete search history.

(56) References Cited

U.S. PATENT DOCUMENTS

| | | |
|---|---|---|
| 5,445,721 A | 8/1995 | Bower |
| 5,620,577 A | 4/1997 | Taylor |
| 7,824,528 B2 | 11/2010 | Dellaert et al. |
| 2003/0136672 A1 | 7/2003 | Barrett |
| 2008/0087541 A1 | 4/2008 | Dellaert et al. |
| 2008/0264786 A1 | 10/2008 | German et al. |
| 2013/0008777 A1 | 1/2013 | Choquette et al. |
| 2014/0021044 A1 | 1/2014 | Simpson et al. |

FOREIGN PATENT DOCUMENTS

| | | |
|---|---|---|
| CN | 101044586 A | 9/2007 |
| CN | 102822381 A | 12/2012 |
| DE | 102014104642 A1 | 10/2015 |
| WO | 2006042808 A1 | 4/2006 |
| WO | 2016033475 A1 | 3/2016 |

OTHER PUBLICATIONS

International Search Report from PCT Application No. PCT/IB2017/053895, dated Sep. 15, 2017.
Office Action from corresponding CN Application No. 201780042651.9, dated Jun. 19, 2020.

ELECTRICAL TRANSFER IN AN ENDBLOCK FOR A SPUTTER DEVICE

FIELD OF THE INVENTION

This invention relates in general to a power transfer system for an endblock in a sputter device for transferring power to the sputter target, and to an endblock which comprises such a power transfer system, and to a corresponding sputter device.

BACKGROUND OF THE INVENTION

An endblock connects the sputter target in the sputter system to the outside of the sputter system. Such an endblock is typically mountable as a component on the sputter system. In parts of the endblock, the pressure may be higher than in the sputter system. The pressure may for example be close to atmospheric pressure. Components which can be removed together with the sputter target, or the removable magnet configuration, are typically not regarded as fixedly belonging to the endblock. The main function of the endblock is to carry the sputter target and rotate the sputter target around the rotation axis. Since sputtering takes place with a gas at low gas pressure, the endblock must be vacuum-tight even during rotation of the sputter target.

Since sputtering of a sputter target can generate a great deal of heat on the sputter target surface, the sputter target must also be cooled. This is typically achieved with water or another suitable coolant. The coolant must be supplied and evacuated via the endblock.

The sputter target must also be supplied with an electrical current in order to bring the sputter target to a specific electrical potential. More specifically, in the endblock, power from the static part of the endblock is transferred to the rotating part of the endblock.

In order to incorporate these different functionalities, each endblock must comprise one or more of the following means: (i) drive means for causing the sputter target to rotate, (ii) a rotatable electrical contact means for obtaining electrical current on the sputter target, (iii) one or more bearings for supporting the sputter target mechanically while it rotates around its axis, (iv) one or more rotatable sealing means for coolant, (v) one or more rotatable vacuum sealing means, and (vi) means for positioning the magnets or a series of magnets.

For combining these functionalities, various configurations of endblocks are already available in the prior art.

"Double right-angled endblocks" as described in U.S. Pat. No. 5,096,562 (FIG. 2 and FIG. 6) and in US 2003/0136672 A1, are endblocks in which the bearing means, the rotation means, the means for electrical supply, the means for cooling and the means for isolation (air, coolant, electrical) are distributed over two endblocks, each situated at one end of the sputter target. "Right-angled" means that the endblocks are mounted on the wall parallel to the rotation axis of the sputter target.

"Single rectilinear endblocks" as described in U.S. Pat. No. 5,200,049 (FIG. 1) are endblocks in which the bearing means, the rotation means, the means for electrical supply, the means for cooling and the means for isolation (air, coolant, electrical) are all combined in one endblock. The sputter target is here mounted on the endblock. The term "rectilinear" means that the rotation axis of the sputter target stands perpendicular to the wall on which the endblock is mounted.

Hybrid configurations for endblocks are described in U.S. Pat. No. 5,620,577 wherein the end of the sputter target, located opposite the end of the sputter target in which the endblock is provided, is supported by a mechanical support element.

Conventionally, the power is transferred in a part of the endblock in which no coolant water is present. In such a configuration, carbon brushes may be used to transfer the power from the static part of the endblock to the rotating part of the endblock.

Correct adjustment of the carbon brushes is achieved by means of a series of adjustment screws, and is a time-intensive task. In addition, correct adjustment must be performed repeatedly because the carbon brushes are subject to wear and must therefore be replaced regularly. There is a need for a system for power transfer which can be installed or replaced in an efficient manner.

In addition, in some cases it is advantageous to form the power transfer between the static part of the endblock and the dynamic part of the endblock in a part of the endblock where coolant is present. The use of carbon brushes in such a configuration is excluded since carbon brushes degrade in a watery environment due to corrosion, and since the lubricating layer, which is typically used to generate a low mechanical and electrical resistance, dissipates rapidly in a watery environment.

SUMMARY OF THE INVENTION

It is an object of the present invention to provide efficient means and systems for transfer of electrical power in an endblock for a sputter device.

It is an advantage of at least some embodiments of the present invention that a power transfer system is provided which is simple to install.

It is an advantage of at least some embodiments of the present invention that a power transfer system is provided which can be used in a part of the endblock in which coolant water is present.

The above-mentioned object is achieved by means and systems according to the present invention.

In one aspect, the present invention concerns a power transfer system for transfer of electrical power to a sputter target in a sputter device, the power transfer system comprising:
a first part comprising a contact surface positionable against a first part of an endblock of the sputter device,
a second part, wherein the first part is inseparably connected to the second part and the second part is inseparably connected to a third part,
a third part comprising a contact surface positionable against a second part of the endblock,
wherein at least two of the three parts are formed monolithically and wherein the first and/or the second and/or the third part is resilient such that, when mounted, the power transfer system is clamped between the first part of the endblock and the second part of the endblock, and wherein this part is also responsible for the transfer of electrical power.

It is an advantage of embodiments of the present invention that separate auxiliary wiring in the endblock for providing the transfer of electrical power can be omitted. The electrical power can be transmitted by means of electrical current passage.

The three parts of the power transfer system are preferably such that they are electrically conductive, so that the power transfer system can transmit electrical power for the sputter target.

It is an advantage of embodiments of the present invention that the power transfer system is easy to install, remove and refit. It is an advantage of embodiments of the present invention in relation to existing systems that there is no need to attach a large number of wires with adjustment screws, which offers a substantial time-saving and simplicity of installation.

It is an advantage of embodiments of the present invention that the power transfer system allows simple replacement.

The at least two of the three parts of the power transfer system may be made as one monolithic piece. It is an advantage of embodiments of the present invention that a power transfer system is provided in which fewer separate elements are present which need each be adjusted individually.

The three parts of the power transfer system can be made from a single material.

The three parts of the power transfer system can be made as a single monolithic piece. The power transfer system may for example be 3D-printed, although embodiments are not restricted to this.

The spring part may be made from an electrically conductive material. In embodiments of the present invention, the spring material may itself be electrically conductive so that the spring material ensures the power transfer.

The contact surface of the first part may be adapted to form a slide contact with the endblock.

The contact surface of the third part may be adapted to form a slide contact with the endblock.

The first part of the endblock may be rotatable in order to rotate the sputter target during a sputter operation.

The second part of the endblock may be rotatable in order to rotate the sputter target during a sputter operation.

The contact surface of the first part and/or the third part of the power transfer system may be formed such that there are several contact areas between the contact surface and the endblock, distributed over the respective contact surface, when the sputter device is in the static state.

The second part of the power transfer system may be the spring and electrically conductive part.

The power transfer system, when mounted in an endblock and the corresponding sputter installation is in operation, may be positioned in cooling water. It is an advantage of embodiments of the present invention that optimum cooling is provided because the power transfer system itself stands in cooling water during use.

The first part of the power transfer system may have a cylindrical form to adjoin the first part of the endblock. The third part may have a cylindrical form adapted to adjoin the second part of the endblock.

At least the spring part may be made of a copper (beryllium) or copper-tin alloy. It is an advantage of embodiments of the present invention that the materials used provide adequate electrical conductivity and at the same time allow sufficient elastic deformation so that the first or third part makes good contact with the rotating part of the endblock.

An additional layer may be present on the contact surface of the first and/or third part of the power transfer system. The use of an additional layer allows the material of this layer to be selected such that the material results in a lubricating function on the contact surface.

The additional layer may be renewable after wear.

The additional layer may be thermally attached to the core.

The additional layer may be made of an alloy which contains tin and copper, or an alloy which contains copper or carbon.

The first part or the third part of the power transfer system may comprise cylindrical elements, wherein the chromed surfaces of the cylindrical elements are formed such that they conform respectively to the first part of the endblock or the second part of the endblock or the sputter target, and wherein the cylindrical elements can be pressed radially against the sputter target or the second part of the endblock by the spring part.

The second part of the power transfer system may comprise one or more helical springs.

The first part and/or the second part of the power transfer system may have a sprung cylindrical form.

The first and/or second part of the power transfer system may consist of a meandering plate placed in a cylindrical surface.

The first part and/or the third part of the power transfer system may be formed as a spongy electrically conductive structure.

The power transfer system may be formed such that the third part of the power transfer system is pressed axially against the edge of the sputter target and/or the edge of the second part of the endblock, wherein the second part of the endblock is adapted to rotate the sputter target.

The power transfer system may be formed such that the third part of the power transfer system is pressed radially against the edge of the sputter target and/or the edge of the second part of the endblock, wherein the second part of the endblock is adapted to rotate the sputter target.

The second part of the power transfer system may consist of an ondular spring which presses the third part of the power transfer system axially against the sputter target or the second part of the endblock when the power transfer system is mounted.

In another aspect, the present invention concerns an endblock for a sputter device which comprises a power transfer system as described above.

In yet another aspect, the present invention concerns a sputter device which comprises a power transfer system as described above.

Specific and preferential aspects of the invention are described in the attached independent and dependent claims. Features of the dependent claims may be combined with features of the independent claims and with features of further dependent claims as suitable and not only as expressly presented in the claims.

These and other aspects of the invention will become clear and be explained below with reference to the embodiment(s) described below.

The figures are merely diagrammatic and not limitative. In the figures, dimensions of some parts may be exaggerated and not shown to scale for illustrative purposes.

Reference numbers in the claims may not be interpreted as restricting the scope of protection. In the various figures, the same reference numbers refer to the same or equivalent elements.

DETAILED DESCRIPTION OF ILLUSTRATIVE EMBODIMENTS

The present invention will be described in relation to particular embodiments and with reference to particular drawings; however, the invention is not restricted to these and is limited only by the claims. The drawings described are purely diagrammatic and not limitative. In the drawings, for illustrative purposes, the dimensions of some elements may be enlarged and not shown to scale. The dimensions and relative dimensions sometimes do not correlate with the actual practical implementation of the invention.

Furthermore, the terms "first", "second", "third" and similar in the description and claims are used to distinguish similar elements and not necessarily to describe an order in either time or place, or in priority or in any other way. It should be understood that the terms used in this way are interchangeable under certain circumstances and that the embodiments of the invention described herein are suitable for working in a different sequence than described or shown here.

In addition, the terms "top", "bottom", "above", "in front of" and similar in the description and claims are used for descriptive purposes and not necessarily to describe relative positions. It should be understood that the terms used in this way under certain circumstances may be mutually interchanged and that embodiments of the invention described here are also suitable for working in other orientations than described or shown here.

It should be noted that the term "comprises" as used in the claims should not be interpreted as restricted to the means described thereafter; this term does not exclude other elements or steps. It should be interpreted as specifying the presence of the said features, values, steps or components to which reference is made, but does not exclude the presence or addition of one or more other features, values, steps or components or groups thereof. Thus the scope of the expression "a device comprising means A and B" should not be restricted to devices which consist only of components A and B. It means that in relation to the present invention, A and B are the only relevant components of the device.

Reference throughout this specification to "one embodiment" or "an embodiment" means that a specific feature, structure or characteristic described in connection with the embodiment is included in at least one embodiment of the present invention. Thus the occurrence of the expressions "in one embodiment" or "in an embodiment" at various points throughout the specification need not necessarily refer to the same embodiment, but may well do so. Also, the specific features, structures or characteristics may be combined in any suitable manner as will be clear to the average person skilled in the art on the basis of this disclosure, in one or more embodiments.

Similarly, it should be appreciated that in the description of exemplary embodiments of the invention, different features of the invention are sometimes grouped into a single embodiment, figure or description thereof, with the aim of streamlining the disclosure and assisting with the understanding of one or more of the various inventive aspects. This method of disclosure should also not be interpreted as a reflection of an intention that the invention requires more features than explicitly named in each claim. Furthermore, as the following claims indicate, inventive aspects lie in less than all features of any single previously disclosed embodiment. Thus the claims following the detailed description are hereby explicitly included in this detailed description, with each stand-alone claim as a separate embodiment of the invention.

Also, while some embodiments described herein contain some but not other features included in other embodiments, combinations of features of different embodiments are considered as lying within the scope of the invention, and form different embodiments as will be understood by the person skilled in the art. For example, in the claims which follow, any of the embodiments described may be used in any arbitrary combination.

In the description provided here, numerous specific details are highlighted. It should be understood that embodiments of the invention may be implemented without these specific details. In other cases, well-known methods, structures and techniques are not shown in detail in order to keep this description concise.

In a first aspect, the present invention concerns a power transfer system for the transfer of electrical power to a sputter target in a sputter device. More specifically, it concerns the transfer of power in a sputter device in which a rotating sputter target is used. Such sputter targets are often rotationally symmetrical sputter targets such as cylindrical sputter targets. In such a sputter device, the sputter target is mounted on an endblock. The endblock has the function amongst others of rotating the sputter target and transmitting electrical power from a static part of the endblock to the dynamic part of the endblock on which the sputter target is mounted. The power transfer system is the means by which this transfer of electrical power is implemented. By way of illustration, the various elements of the power transfer system will be described with reference to FIG. 1, although embodiments are not restricted to this. The power transfer system 100 according to the present invention comprises a first part 110 comprising a contact surface 115 which is positionable against a first part 210 of an endblock 200 of the sputter device. It also comprises a second part 120 which is inseparably connected to the first part 110 and a third part 130. It therefore also comprises a third part 130 comprising a contact surface 135 positionable against a second part 220 of the endblock 200. According to the present invention, at least two of the three parts 110, 120, 130 of the power transfer system 100 are formed monolithically. Optionally, at least two of the three parts may be made of the same material. In addition, one of the three parts 110, 120, 130 is configured such that it is resilient, so that when the power transfer system 100 is installed, the power transfer system 100 is clamped between the first part 210 of the endblock 200 and the second part 220 of the endblock 200. In addition, this part is also responsible for the transfer of electrical power to the sputter target. This may avoid the need for separate wiring. The configuration is such that typically, one of the parts 110, 120, 130 is in contact with a static part of the endblock while another part is in contact with the dynamic part of the endblock. Both the first part of the endblock and the second part of the endblock can function as the dynamic part on which the sputter target is mounted. In addition, the slide contact formed by the power transfer system 100 lies both against the dynamic part of the endblock 200 and against the static part of the endblock 200. In the first case, the power transfer system 100 is static, while in the second case the power transfer 100 moves with the dynamic part of the endblock.

Figure 1:
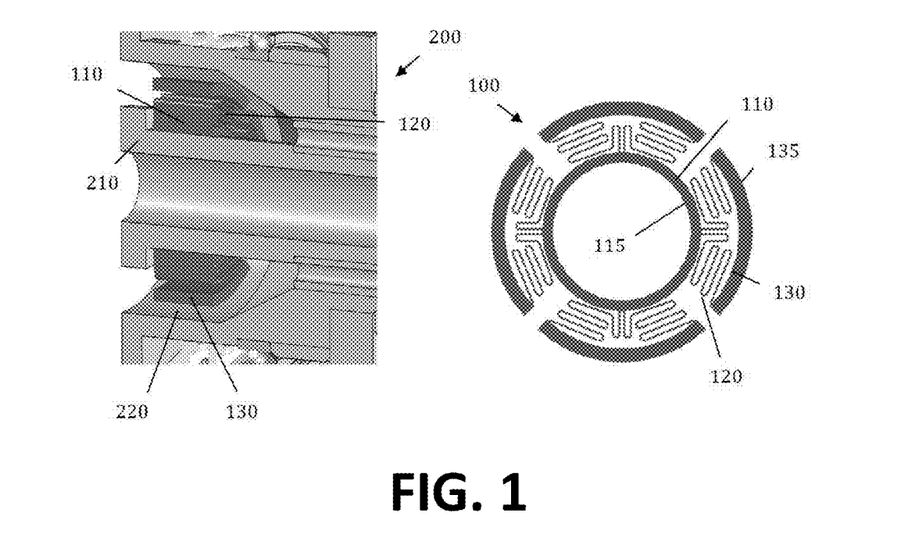
FIG. 1 shows a top view of a first power transfer system with spring element (right) and a cross-section of an endblock with such a power transfer system (left) according to one embodiment of the present invention.

Thus with reference to FIG. 1, although the first part 110 is shown as being the innermost part of the power transfer system 100, which in this case is connected to the static part of the endblock 200, and the third part 130 is shown as the outermost part of the power transfer system, which forms a slide contact against the dynamic part of the endblock 200, this is not strictly necessarily the case. The dynamic part of the endblock 200 (on which the target is mounted and which rotates) may be provided both centrally and on the outer edge of the endblock 200, and the slide contact provided for the power transfer system 100 may be provided both against the dynamic and against the static part of the endblock 200.

In preferred embodiments of the present invention, as stated above, at least two of the three parts are made from the same material. In some cases, all parts of the power transfer system 100 are made of the same material (possibly with an additional layer). The material may be a sprung material which at the same time is electrically conductive. In one example, this material may be a copper-beryllium alloy. In another embodiment, this material may be a copper-tin alloy.

In preferred embodiments of the present invention, at least two or all different parts of the power transfer system are made as one monolithic piece.

In embodiments of the present invention, the contact surface 115, 135 of the first part 110 and/or the third part 130 which behaves as a slide contact is formed such that it has several contact regions with the endblock 200 when the sputter device is in the static state, i.e. when the sputter target is not rotating. The contact surface 115, 135 may for example be annular, or combine various separate contact surfaces located for example on a single annular surface.

In some embodiments, the slide contact is provided with an additional layer. This layer may for example be renewable after wear. This additional layer may be attached to the power transfer system by means of thermal bonding, although embodiments are not restricted to this. Such an additional layer may for example be selected such that it has a lubricating function. It may for example be made from an alloy which comprises tin and copper, or from an alloy which comprises copper or carbon.

The left-hand side in FIG. 1 shows part of an endblock 200 in which the power transfer system 100 is positioned.

By way of illustration, although embodiments of the present invention are not limited to this, various specific examples of power transfer systems are discussed in relation to FIG. 2 to FIG. 8.

Figure 2:
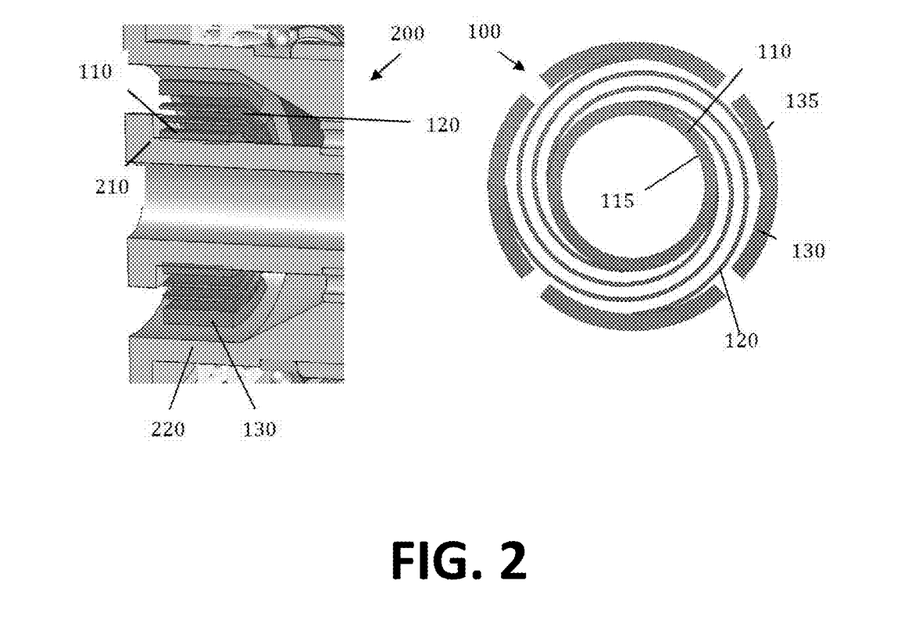
FIG. 2 shows a top view of another power transfer system with helical spring element (right) and a cross-section of an endblock with such a power transfer system (left) according to one embodiment of the present invention.

FIG. 2 illustrates another example of a power transfer system 100 (right) and an endblock 200 (left) in which such a power transfer system 100 is installed. The power transfer system 100 in the present example has a second part 120 in the form of a helical spring. This supplies the necessary spring force to press the first part 110 and the third part 130 against the static part and the dynamic part of the endblock. Since in the present example all three of the elements are electrically conductive, the power can be transmitted via this power transfer system 100.

Figure 3:
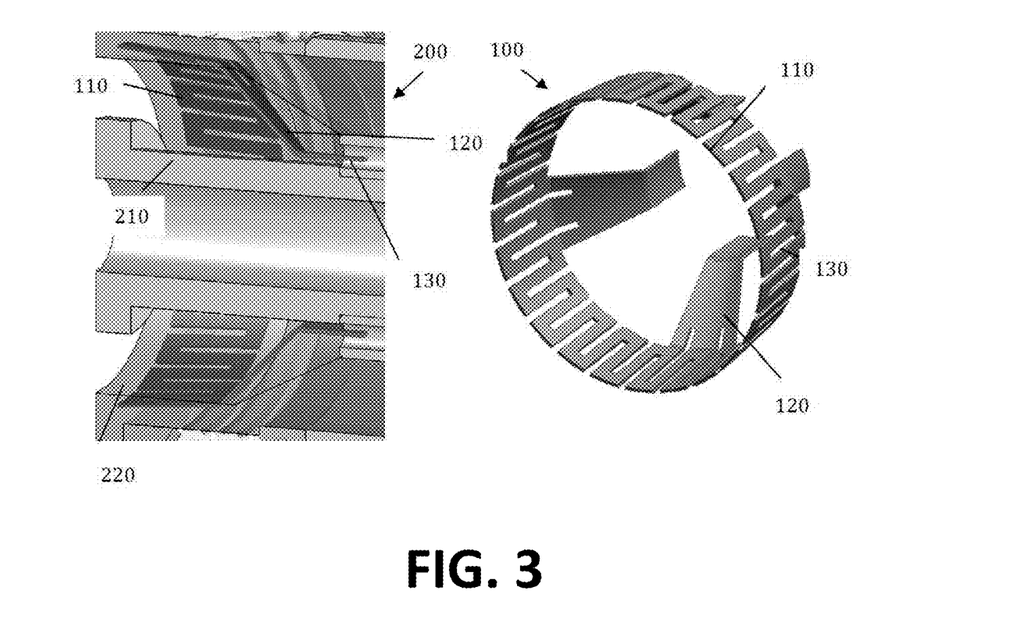
FIG. 3 shows a top view of another power transfer system with a meandering third element (right) and a cross-section of an endblock with such a power transfer system (left) according to one embodiment of the present invention.

FIG. 3 illustrates an alternative example in which again a first part 110, a second part 120 and a third part 130 of the power transfer system 100 are shown. The second part again provides the necessary spring force for pressing the first part 110 and the third part 130 against the static and dynamic part of the endblock. The contact surface from the third part 130 takes the form of a meander which ensures a large contact surface for power transfer.

Figure 4:
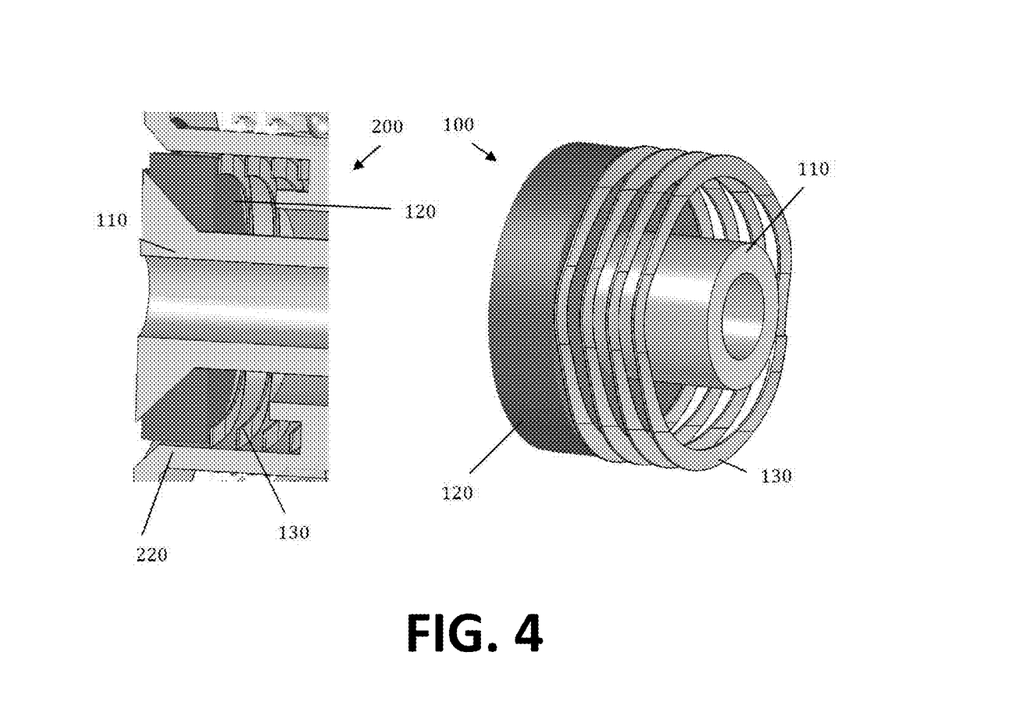
FIG. 4 shows a top view of another power transfer system with ondular springs (right) and a cross-section of an endblock with such a power transfer system (left) according to one embodiment of the present invention.

FIG. 4 shows a further alternative example which uses an ondular spring. In this example, an axial force is exerted rather than a radial force. In embodiments of the present invention, a system may also be used in which a radial force is exerted in order to clamp the power transfer system. Such an embodiment may for example result from the embodiment in FIG. 4 by changing the oblique side, shown on the left of the figure, so that it stands perpendicular to the axis, whereby a radial force is exerted by the spring system.

Figure 5:
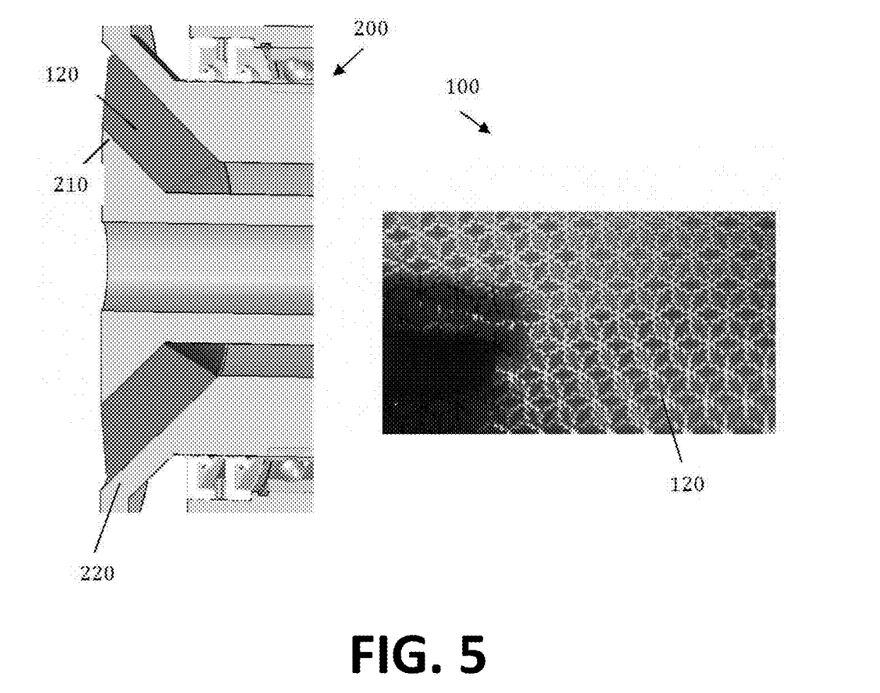
FIG. 5 shows a top view of another power transfer system with a spongy spring element (right) and a cross-section of an endblock with such a power transfer system (left) according to one embodiment of the present invention.

FIG. 5 illustrates a further alternative in which the power transfer system comprises a spring element with a spongy structure. This spring element also provides a spring force, whereby the power transfer system presses on one side against the static part and on the other side against the dynamic part of the endblock.

Figure 6:
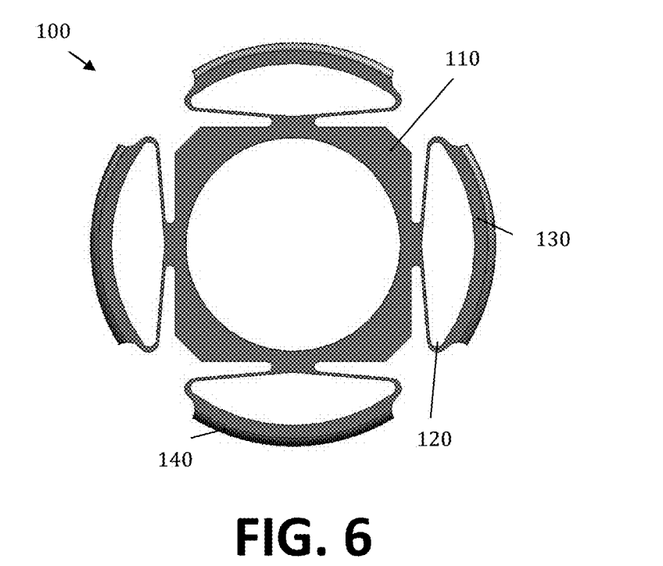
FIG. 6 to FIG. 8 each show a top view of alternative examples of a power transfer system according to embodiments of the present invention.
Figure 7:
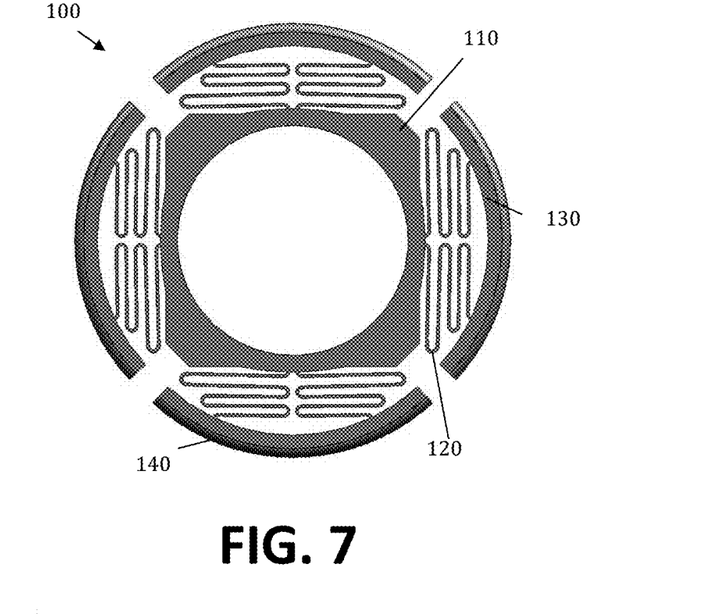
Figure 8:
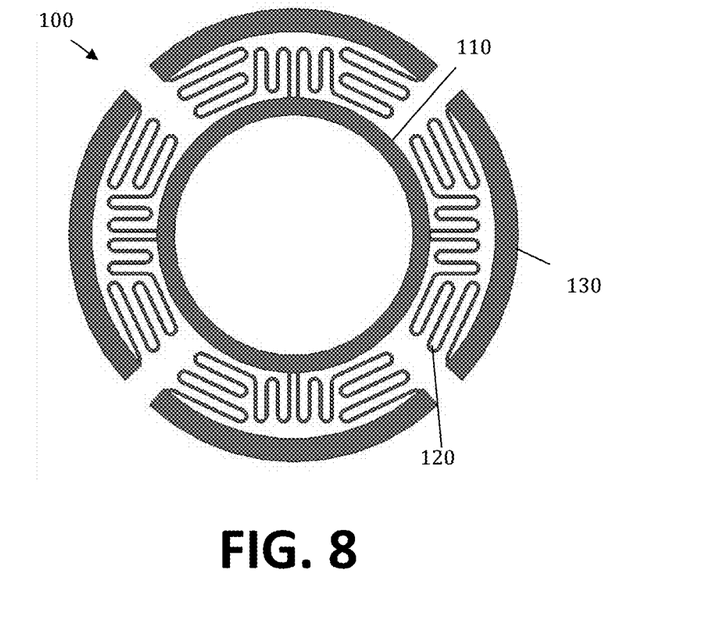

FIG. 6 to FIG. 8 illustrate further examples of power transfer systems in which the second part is a spring element. The spring force of this spring element is obtained by the specific form in which the material is folded, in combination with the material used. It is an advantage of some embodiments of the present invention that a large contact area can be obtained between the power transfer system and the endblock.

FIG. 6 and FIG. 7 also show an additional layer 140 positioned on the third element. Such a layer may improve the electrical contact between the power transfer system and the endblock.

In another aspect, the present invention also concerns an endblock which comprises a power transfer system as described above. Features and advantages of the sputter device correspond to features and advantages of the power transfer system as described above.

In a further aspect, the present invention also concerns a sputter device which comprises an endblock as described above. Features and advantages of the sputter device correspond to features and advantages of the endblock as described above.

The invention claimed is:

1. A power transmission system for transmission of electrical power to a sputter target in a sputter device, the power transmission system comprising:
   a first part comprising a contact surface positionable against a first part of an endblock of the sputter device,
   a second part, wherein the first part is inseparably connected to the second part and the second part is inseparably connected to a third part,
   a third part comprising a contact surface positionable against a second part of the endblock,
   wherein at least two of the three parts of the power transmission system are formed as one monolithic piece, and
   wherein the first and/or the second and/or the third part is spring-loaded such that, when mounted, the power transmission system is clamped between the first part of the endblock and the second part of the endblock, and wherein the first and/or the second and/or the third part of the power transmission system is also responsible for the transmission of electrical power.

2. The power transmission system according to claim 1, wherein at least two of the three parts of the power transmission system are made from the same material.

3. The power transmission system according to claim 1, wherein the three parts of the power transmission system are made as one monolithic part.

4. The power transmission system according to claim 1, wherein a spring in the first and/or the second and/or the third part that is spring-loaded is from an electrically conductive material.

5. The power transmission system according to claim 1, wherein the contact surface of the first part of the power transmission system is adapted to form a slide contact with the endblock or wherein the contact surface of the third part of the power transmission system is adapted to form a slide contact with the endblock.

6. The power transmission system according to claim 1, wherein the first part of the endblock is rotatable in order to rotate the sputter target during a sputter operation or wherein the second part of the endblock is rotatable in order to rotate the sputter target during a sputter operation.

7. The power transmission system according to claim 1, wherein a contact surface of the first part and/or the third part of the power transmission system is formed such that there are several contact areas between the contact surface and the endblock, distributed over the contact surface, when the sputter device is in a static state.

8. The power transmission system according to claim 1, wherein the second part of the power transmission system is a spring and electrically conductive part.

9. The power transmission system according to claim 1, wherein the power transmission system, when mounted in a endblock and the corresponding sputter installation is in operation, is positioned in cooling water.

10. The power transmission system according to claim 1, wherein the first part of the power transmission system has a cylindrical form adapted to adjoin to the first part of the endblock, and/or wherein the third part of the power transmission system has a cylindrical form adapted to adjoin the second part of the endblock or the inside of a cylindrical target.

11. The power transmission system according to claim 1, wherein at least the spring part is made of a copper-beryllium alloy or a copper-tin alloy.

12. The power transmission system according to claim 1, wherein an additional layer is present on a contact surface of the first and/or third part.

13. The power transmission system according to claim 12, wherein the additional layer is renewable after wear and/or wherein the additional layer is thermally attached to a core and/or wherein the additional layer is made of an alloy which contains tin and copper, or an alloy which contains copper or carbon.

14. The power transmission system according to claim 1, wherein the first part or the third part of the power transmission system comprises cylindrical elements, wherein chromed surfaces of the cylindrical elements are formed such that they conform respectively to the first part of the endblock or the second part of the endblock or the sputter target, and wherein the cylindrical elements can be pressed radially against the second part of the endblock by a spring part.

15. The power transmission system according to claim 1, wherein the second part of the power transmission system comprises one or more helical springs.

16. The power transmission system according to claim 1, wherein the first part and/or the third part of the power transmission system may have a sprung cylindrical form or wherein the first and/or the third part of the power transmission system consists of a meandering plate placed in a cylindrical surface or wherein the first part and/or the third part of the power transmission system is formed as a spongy electrically conductive structure.

17. The power transmission system according to claim 1, wherein the power transmission system is formed such that the third part of the power transmission system is pressed axially against the edge of the second part of the endblock, wherein the second part of the endblock is adapted to rotate the sputter target.

18. The power transmission system according to claim 17, wherein the second part of the power transmission system consists of an ondular spring which presses the third part of the power transmission system axially against the sputter target or the second part of the endblock when the power transmission system is mounted.

19. An endblock for a sputter device which comprises a power transmission system according to claim 1.

20. A sputter device which comprises a power transmission system according to claim 1.

* * * * *